(12) United States Patent
Hung et al.

(10) Patent No.: US 7,730,898 B2
(45) Date of Patent: Jun. 8, 2010

(54) SEMICONDUCTOR WAFER LIFTER

(75) Inventors: Yang Cheng Hung, Taoyuan (TW); Kuo Liang Lu, Hsinchu (TW); Tseng Wen Song, Taitung (TW); Chen Peir Horng, Taoyuan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 946 days.

(21) Appl. No.: 11/069,129

(22) Filed: Mar. 1, 2005

(65) Prior Publication Data

US 2006/0196530 A1  Sep. 7, 2006

(51) Int. Cl.
    *B08B 3/00* (2006.01)

(52) U.S. Cl. .................. 134/137; 134/902; 156/345.11; 156/345.23; 156/345.51; 156/345.54; 118/428; 204/285

(58) Field of Classification Search .................. 134/60, 134/61, 131, 133, 134, 902; 156/345.11, 156/345.23, 345.51–345.55; 118/428; 204/285
See application file for complete search history.

(56) References Cited

U.S. PATENT DOCUMENTS

| | | | |
|---|---|---|---|
| 5,011,041 A * | 4/1991 | Kakizaki | 220/507 |
| 5,193,682 A * | 3/1993 | Naito et al. | 206/454 |
| 5,672,212 A | 9/1997 | Manos | |
| 5,868,865 A | 2/1999 | Akimoto | |
| 5,908,042 A * | 6/1999 | Fukunaga et al. | 134/25.1 |
| 6,009,890 A * | 1/2000 | Kaneko et al. | 134/133 |
| 6,068,089 A | 5/2000 | Brooks et al. | |
| 6,071,373 A | 6/2000 | Kang et al. | |
| 6,337,030 B1 | 1/2002 | Sakaguchi | |
| 6,365,064 B1 | 4/2002 | Tsai et al. | |
| 6,532,975 B1 | 3/2003 | Kamikawa et al. | |
| 6,651,704 B2 | 11/2003 | Ma | |
| 6,743,296 B2 | 6/2004 | Kao | |
| 6,752,897 B2 | 6/2004 | Jang et al. | |
| 2003/0082920 A1 | 5/2003 | Huang et al. | |
| 2003/0181042 A1 | 9/2003 | Chen et al. | |
| 2003/0201001 A1 | 10/2003 | Chien et al. | |
| 2004/0040660 A1 * | 3/2004 | Biberger et al. | 156/345.31 |
| 2004/0194814 A1 * | 10/2004 | Nishimura | 134/32 |

* cited by examiner

*Primary Examiner*—Michael Barr
*Assistant Examiner*—David Cormier
(74) *Attorney, Agent, or Firm*—Duane Morris LLP

(57) ABSTRACT

A novel semiconductor wafer lifter is disclosed for handling wafers during wet bench processing. In particular, the lifter has a plurality of holes formed in its vertical support surface to allow cleaning or rinsing fluid to flow through the vertical support instead of around its sides. These holes facilitates a constant flow of fluid across the wafer during recirculation of the tank contents during etching and rinsing operations, thus ensuring more even etching of all wafers and minimizing the deposition of particulate matter on wafer surfaces.

12 Claims, 5 Drawing Sheets

SEMICONDUCTOR WAFER LIFTER

FIELD OF THE INVENTION

The present invention relates to a device for lifting and handling semiconductor wafers during wet bench procedures.

BACKGROUND OF THE INVENTION

The process of semiconductor manufacturing involves a wide variety of steps including a layer formation process for forming multiple layers such as polycrystalline, oxide, nitride layer, metal, etc., on a wafer as a semiconductor substrate. These steps generally also include a diffusion process, a photolightography process, an etching process, a cleaning process, etc., which are carried out between the steps of layer formation.

Etching is a process in which selected material is removed from a silicon substrate or from thin films on the substrate surface. In one type of selective etching, a mask layer is used to protect specific regions of a substrate on a wafer surface, then a selective etch removes material not covered by the mask. Etching can be performed through two methods, one is dry etching using gas, while another is wet etching using wet chemical. Plasma etching, ion beam etching and reactive ion etching are included in the former, while immersion etching and spray etching are included in the latter.

A common device for wet chemical etching of semiconductor wafers is an immersion chemical cleaning device, also called a wet bench, which includes a plurality of chemical tanks, cleaning tanks, robots, and driers. Batches of wafers are move in sequence through the tanks, typically by operation of a computer-controlled automated apparatus. Currently, semiconductor manufacturers use wet cleaning processes which may use cleaning agents such as deionized (DI) water and/or surfactants. Other wafer-cleaning processes utilize solvents, dry cleaning using high-velocity gas jets, and a megasonic cleaning process, in which high-frequency sound waves are used to dislodge particles from the wafer surface.

One process performed using the wet bench is the "wet etch" process, which involves immersion of the wafer in an organic solution. Usually, a plurality semiconductor wafers are simultaneously immersed into the solution, and the reactants in the solution react with constituent molecules on the wafer surface to produce various gaseous and liquid chemical compounds, which remain in the organic solution after etching is complete. Wet etching of Silicon Nitride ($Si_3N_4$) can be performed using a solution of about 85% deionized (DI) water and about 15% phosphoric acid ($H_3PO_4$), at a temperature of between about 150° C. to about 185° C.

One problem with the wet etch process is that unwanted silicon nitride or silicon dioxide particulate impurities can be formed in the etchant when the hot phosphoric acid reacts with silicon nitride and when the mask material is being from the wafer. If the particulate matter generated during the etching process are re-deposited on portions of the wafer in which circuitry is being defined, they can cause defects in the circuitry. As device geometries continue to shrink, these particles will become larger compared with the device geometries and the defects will correspondingly be more critical. These defects can result in non-functional electronic devices, which reduce the unit yield per wafer and correspondingly increase the cost of production per unit.

SUMMARY OF THE INVENTION

A semiconductor wafer handling device is disclosed, comprising a first process tank having a fluid supply line for supplying fluid to the tank, a lift control apparatus, and a lifting member. The lifting member can be positionable within the process tank using the lift control apparatus. The lifting member can comprise a wafer engaging portion for engaging a semiconductor wafer and a lifting portion for engaging the lift control apparatus. The lifting portion further can have a front surface and a back surface and at least one fluid-flow bore in communication therewith. As such, when the lifting member is positioned within the tank and fluid is supplied to the tank via the fluid supply line, the fluid is movable through the bore to contact a surface of the semiconductor wafer.

A semiconductor wafer handling device is disclosed, comprising a fluid process tank, a fluid circulation loop for supplying fluid to the fluid process tank, a lift control apparatus, and a wafer lifter. The wafer lifter can comprise a wafer support portion and a wafer lifting portion. The support portion can be configured to engage a plurality of semiconductor wafers. The lifting portion can be connected to the lift control apparatus for moving the wafer lifter with respect to the fluid process tank. The lifting portion further can have a through-bore in communication with front and back surfaces of the lifting portion. Thus configured, when the fluid circulation loop supplies fluid to the fluid process tank, the fluid is movable through the bore.

A wafer handling device is disclosed, comprising a wafer processing tank and a wafer lifter. The wafer lifter can comprise a wafer support portion and a wafer lifting portion. The wafer support portion can have a support plane and a plurality of grooves. The grooves can be configured to engage and hold a plurality of semiconductor wafers in a substantially vertical orientation with respect to the support plane. The wafer lifting portion further can have a through-bore in communication with the front and back surfaces of the lifting portion. Thus, the wafer lifter can be positionable within the tank to allow fluid disposed in the tank to move between the front and back surfaces of the lifting portion via the through-bore.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts, and further wherein.

DETAILED DESCRIPTION

Figure 1A:
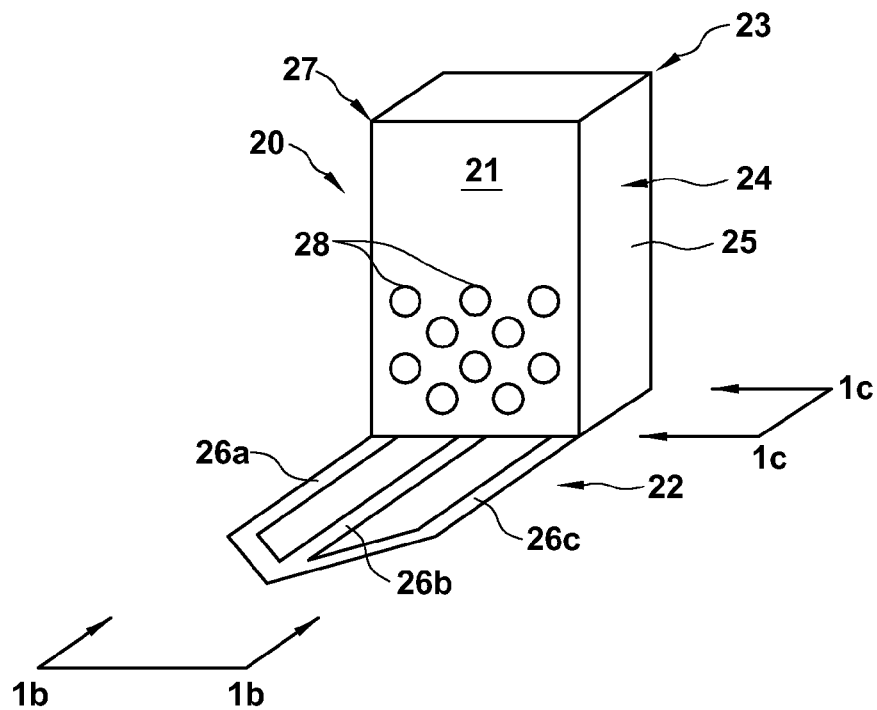
FIG. 1a is a perspective view of a lifter having a plurality of flow through-holes.
Figure 1B:
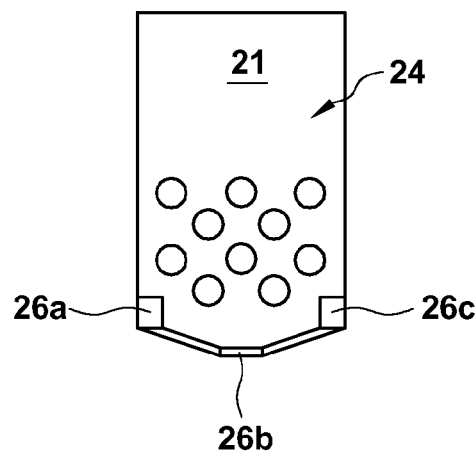
FIG. 1b is an end view of the lifter of FIG. 1a, taken along line 1b-1b.
Figure 1C:
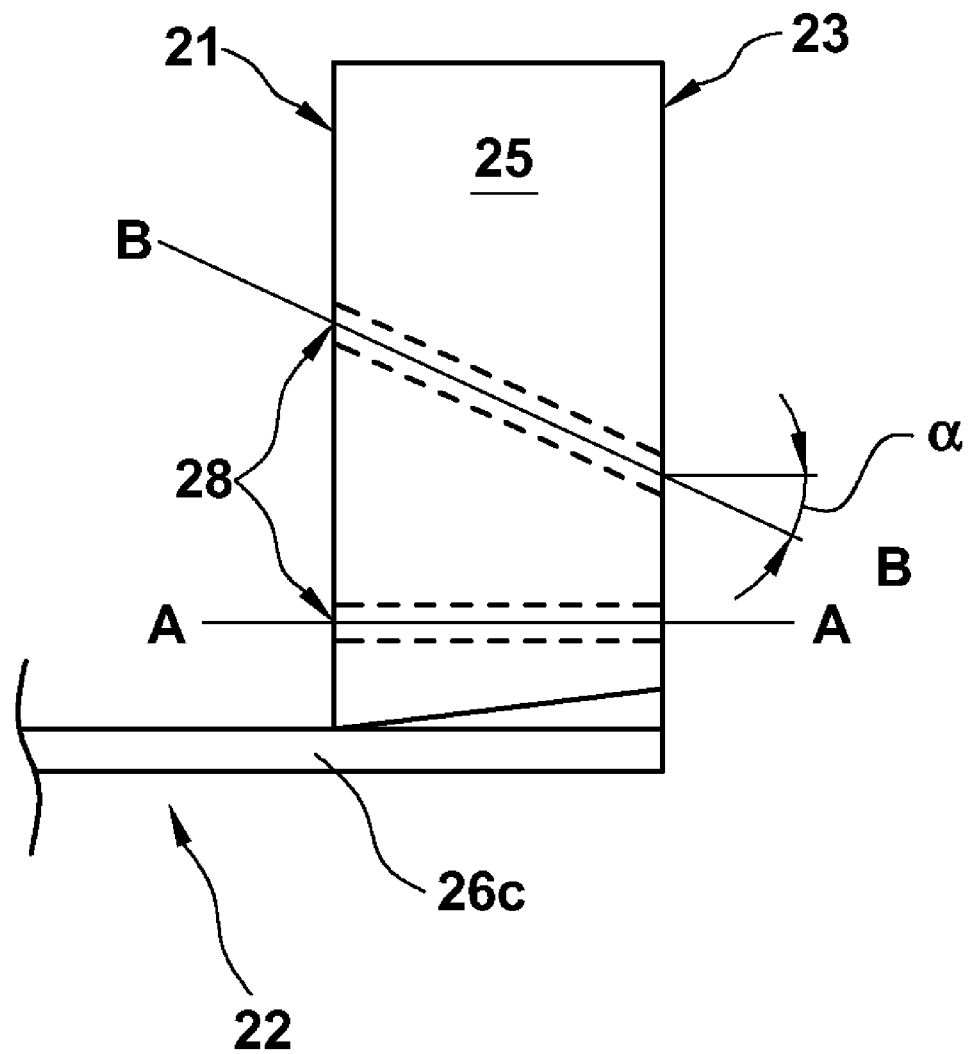
FIG. 1c is a side section view of the lifter if FIG. 1a, taken along line 1c-1c.

According to an embodiment of the present invention, disclosed herein is a lifter 20 for use in handling and manipulating semiconductor wafers during a wet etching process. Referring to FIGS. 1a-c, lifter 20 is shown having a generally horizontally oriented basket portion 22 and a generally vertically oriented lifting portion 24. The basket portion 22 has a plurality of ribs 26a-c that engage the semiconductor wafer or wafer cassette being submerged in the etching tank. The ribs 26a-c may be oriented so that the basket portion 22 forms a planar surface for supporting the wafer or cassette, or the center rib 26b may be positioned slightly lower than the outer ribs 26a, c to provide a slightly V-shaped cross-section to the basket to cradle the supported wafer or cassette. The lifting portion 24 can have a solid flat member connected at a lower end to the basket portion 22, and at an upper end to a lifting apparatus 15 that provides the controlled movement of the lifter 20 with respect to the etchant tank 30 (see FIG. 2). The lifting portion 24 can be connected to the lifting apparatus 15 by any of a variety of means, including screwing, bolting, etc.

Figure 2A:
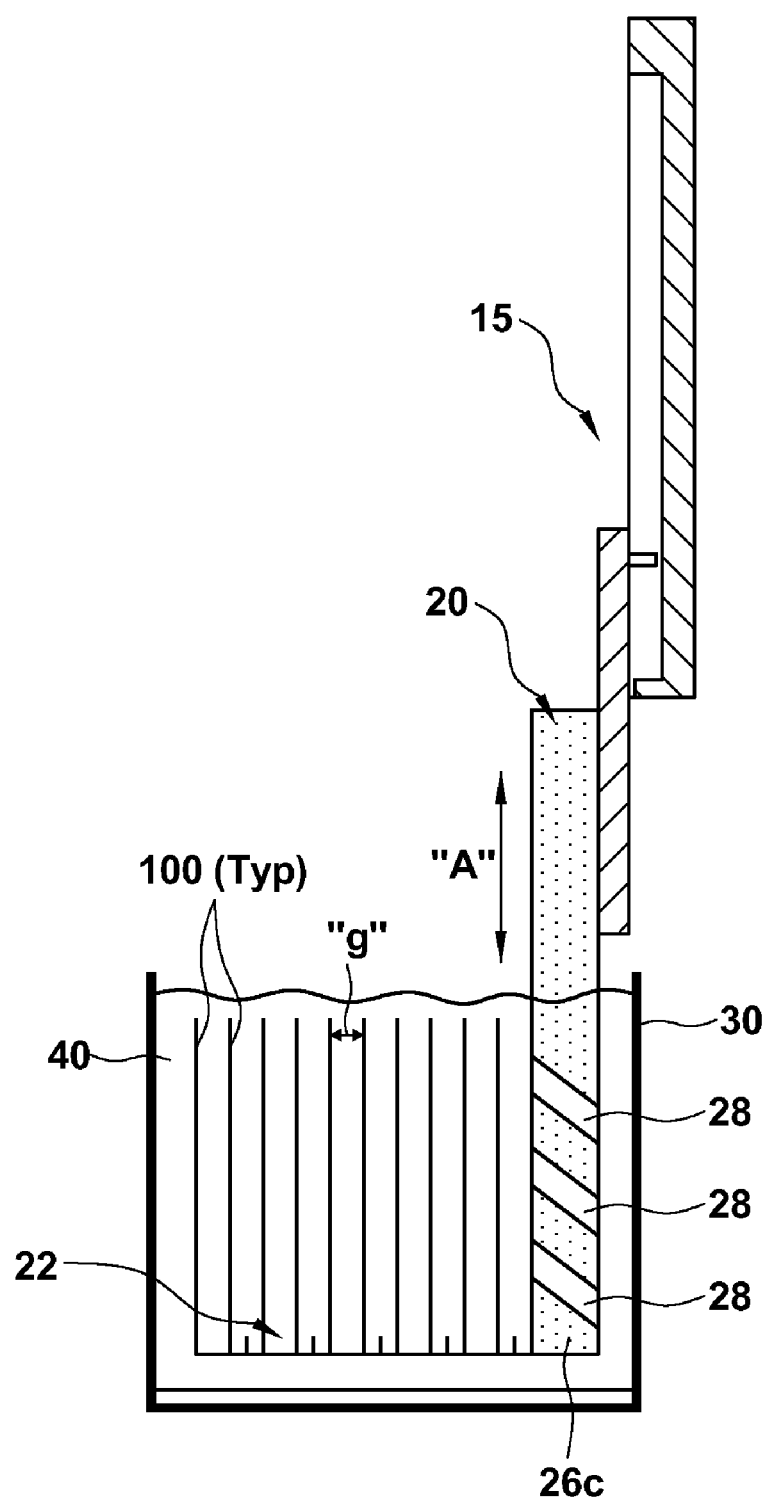
FIG. 2a is a side section view of the lifter of FIG. 1a holding a plurality of wafers and disposed in an exemplary fluid process tank.
Figure 2B:
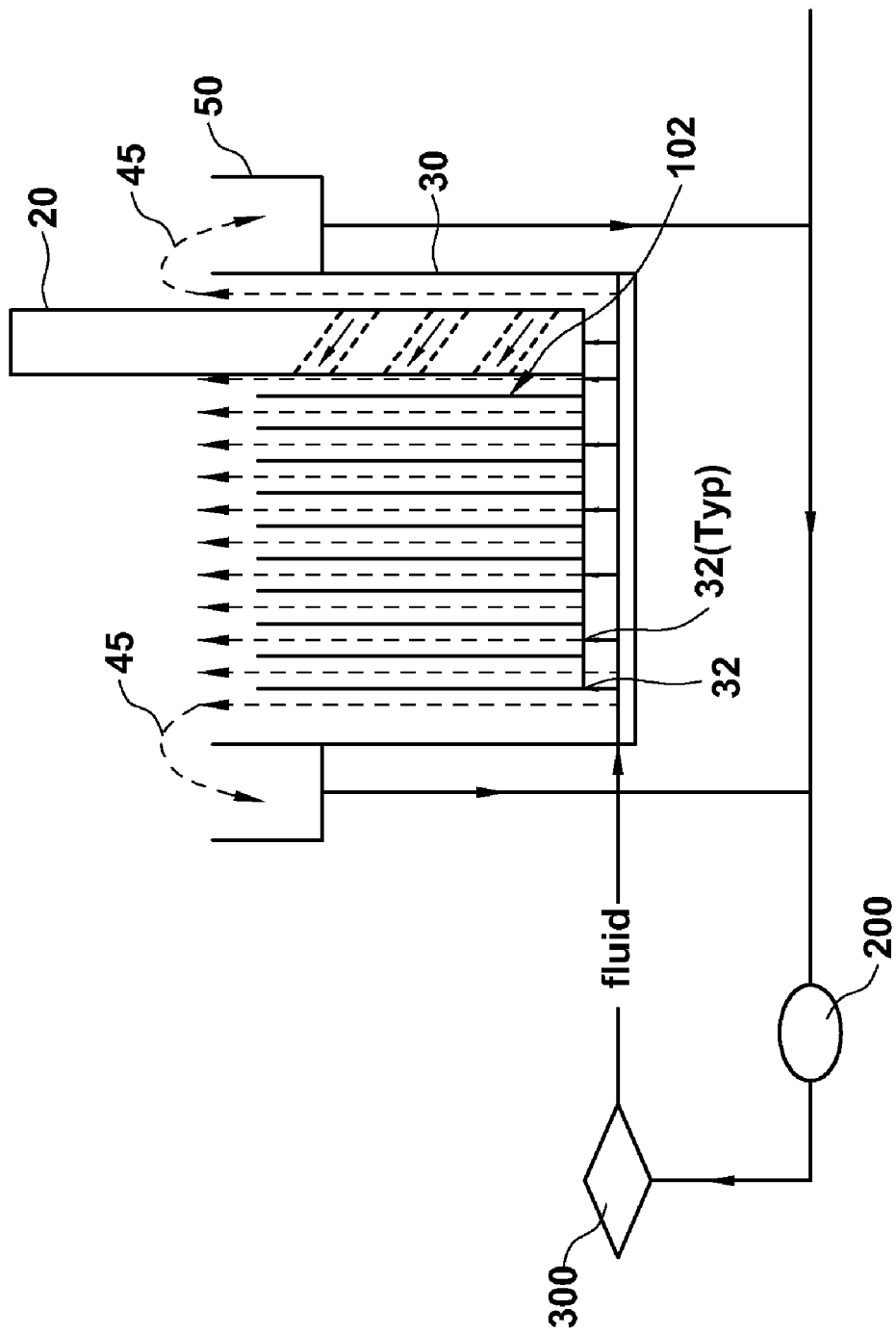
FIG. 2b is the side view of FIG. 2a, further illustrating the fluid pumping, overflow, and filtering scheme, as well as the fluid flow paths within the fluid process tank.
Figure 3:
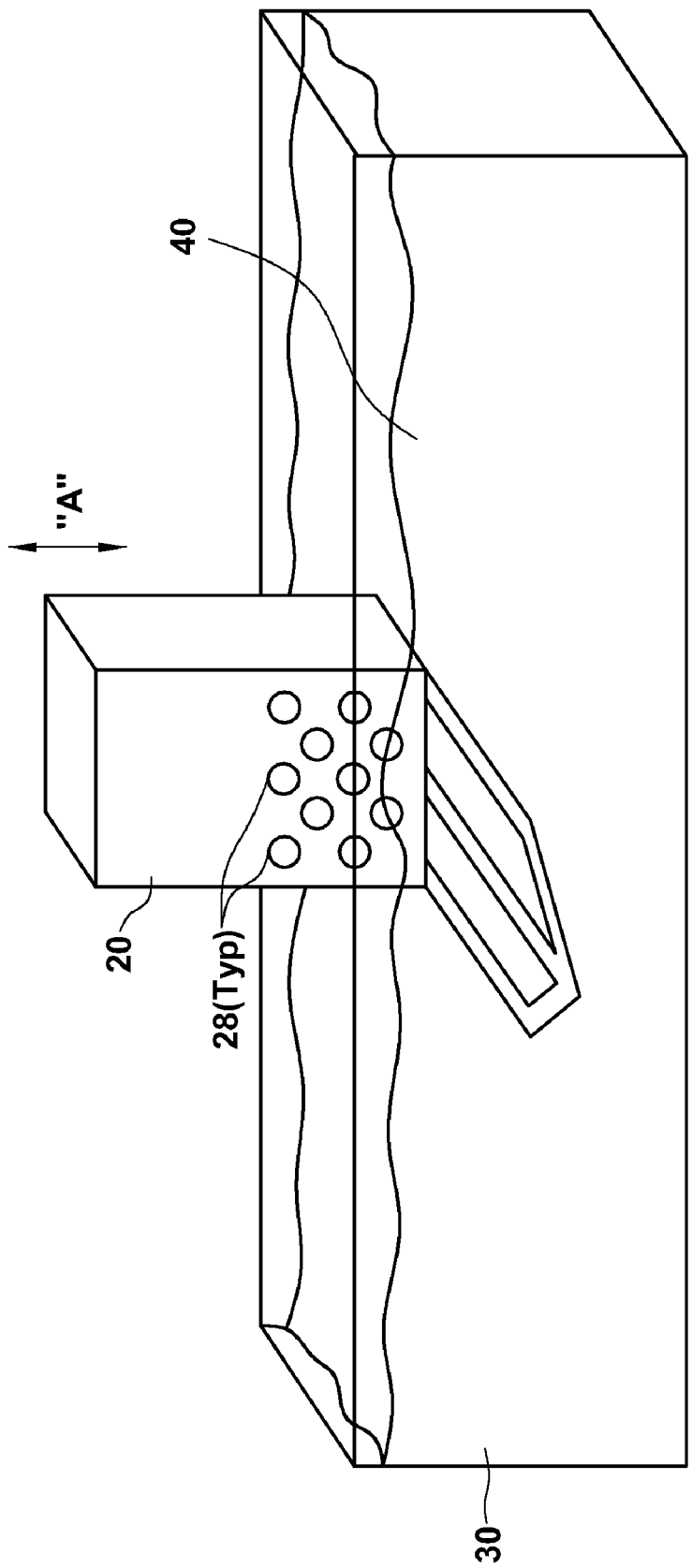
FIG. 3 is a perspective view of the lifter of FIGS. 1a-c in an exemplary fluid process tank.

As illustrated in FIGS. 2a-b and 3, the lifter 20 is associated with an etchant tank 30 and is vertically movable (as indicated by arrow "A") with respect to the tank to allow it to be positioned above or below the level of the fluid 40 contained therein. The lifting portion 24 is connected to a lifting apparatus 15 to allow controlled movement of the lifter in and out of the tank. Various manual, semi-automatic and fully automated wet bench and wet etch systems are known. Such systems can provide automated positioning of the lifter 20 and typically are controlled by a computer that is programmable to precisely limit the position of the wafers in the etchant, as well as the amount of time the wafers are submerged.

As illustrated in FIG. 2, the basket portion 22 of the lifter 20 can be sized and configured to engage individual semiconductor wafers 100 oriented vertically on the basket portion. Alternatively, the basket portion 22 can receive a wafer cassette (not shown), which itself contains a plurality of wafers 100. In the instance in which the lifter is configured to engage individual wafers, the ribs 26a-c can be configured with a multiplicity of corresponding transversely-oriented grooves (not shown) that can hold the individual wafers upright and next to each other, separated by a small gap "g" (see FIG. 2a). The ribs 26a-c can be oriented to provide a substantially planar supporting structure, or, as best shown in FIG. 2b, the center rib 26b can be positioned slightly lower than the outer ribs 26a, c so as to provide a "v-shaped" profile that allows the lifter to cradle the wafers or cassette.

The ribs of the basket portion 22 allow etchant to freely flow through the bottom of the lifter 20 during tank recirculation processes such as etching and rinsing, as well as when the device is removed from the etchant (or rinsing fluid) at the end of the associated process cycle. This free flow of fluid is important because it ensures that the particles generated during the etching process are carried out and away from the wafers so that they may be filtered out of the fluid. Stagnant flow, or the generation of relatively quiescent flow regions, can cause the particulate matter entrained in the fluid to settle out and deposit on the surface of the wafers. As previously discussed, this particulate matter can cause device defects that result in lower production yields.

It has been discovered that such a region of stagnant or quiescent flow can exist adjacent the lifting portion 24 of the wafer lifter, which can result in an undesirable amount of particulate matter being deposited on the side of the wafer closest to the lifting portion 24.

As illustrated in FIG. 1a, the vertical lifting portion 24 can be generally rectangular in shape, and can have front, back and side surfaces 21, 23, 25, 27. The lifting portion 24 also can have a plurality of through-holes 28 disposed between, and in communication with, the front and back surfaces 21, 23. Like the ribs 26a-c of the basket portion 22, these through-holes 28 allow the etchant fluid to drain relatively quickly and evenly away from the wafers. Preferably these through-holes 28 are located in the region of the lifting portion 24 that is directly adjacent to the supported wafers to allow the tank fluid to flow through the lifting portion, thus minimizing or eliminating the stagnant flow condition previously noted.

As shown in FIG. 1c, the through-holes 28 can have axes "A-A" oriented substantially parallel to the ribs 26a-c of the basket portion or they may have axes "B-B" that form an acute angle "α" with respect to the ribs 26a-c. In a preferred embodiment, shown in FIGS. 1c and 2a-b, the through holes 28 are angled to enhance the circulation of tank fluid past the lifter-side wafer, as shown in FIG. 2b. The through holes 28 can be provided having any appropriate combination of size, number and orientation, as appropriate for the particular processing evolution. In the illustrated embodiment, 10 holes are provided in the vertical portion 24. The size and number of the individual holes 28 should be balanced with the need to maintain sufficient strength (including fatigue strength) of the lifter 20, particularly where a significant number of wafers (e.g. as many as 50) are being lifted.

Referring to FIGS. 2a and 2b, an exemplary lifter 20 is shown carrying a plurality of semiconductor wafers 100. The lifter 20 and wafers 100 are disposed in a fluid process tank 30 that is filled with process fluid 40 (which in one embodiment is a hot phosphoric acid ($H_3PO_4$) solution, used for wet etching of Silicon Nitride ($Si_3N_4$)). As shown in FIG. 2b, additional process equipment can be provided, such as fluid recirculation setup including a recirculation pump 200 and filter 300 which are operable to continuously move the process fluid 40 through the tank 30. In one embodiment, an overflow tank 50 is provided and surrounds the upper portion of the fluid process tank 30 to catch overflow from the top of the process tank and to direct it to the suction side of the recirculation pump 200. Filter 300 is connected to the pump discharge and operates to remove etch-generated particulate matter from the fluid 40 before it is pumped back into the process tank 30.

When the wafers are submerged beneath the surface of the fluid, additional quantities of fluid 40 are then supplied to the process tank 30 via a plurality of nozzles 32 (FIG. 2b), which can be evenly disposed across the tank to provide an even flow of process fluid between each of the wafers 100. As noted, and as illustrated by the dashed arrows in FIG. 2b, this supply of fluid 40 causes the process tank to overflow, with the overflowing liquid carrying the suspended particulate matter shed from the wafers due to the etching process. The overflow is caught by the overflow tank 50 and is directed to the pump 200 and then to the filter 300, where the particulate matter is removed from the fluid flow before the fluid is directed back to the process tank 30.

The even supply of fluid 30 between the wafers 100 is important for the etching process, in order to ensure that etching of the individual wafers occurs at a substantially even rate. The present invention facilitates the even movement of fluid through the tank by allowing the process fluid 40 to pass through the angled holes 28 in the vertical lifting portion 24 of the lifter 20 thus ensuring that an appropriate flow of process fluid 40 is directed to the wafer surface 102 located directly adjacent the lifting portion 24. This ensures both that the wafer surface 102 is etched at the same rate as the other wafers in the tank, and also ensures that particulate matter does not deposit on the surface 102 at an inordinate rate.

The recirculation process has been described in relation to the wet etching process, but is equally applicable to the rinsing process. To rinse the wafers 100, both to remove remaining liquid etchant and also to remove any remaining particulate from the surfaces of the wafers, the lifter 20 is employed to lift the wafers from the etchant tank and to place them into, for example, a DI water tank. During the rinsing process the DI water may be recirculated through the tank in the same manner, and using similar equipment, including overflow tank, pump, filter, and related fluid lines and supply nozzles, as was used for the etching process. Thus, during recirculation rinsing, DI water is provided by supply nozzles located beneath and between the wafers 100. The DI water moves through the holes 28 in the lifting portion 24 to flush the wafer surface 102 of the wafer 100 located directly adjacent the lifting portion, thus maximizing removal of any remaining particulate matter from that surface 102.

The lifter preferably is fabricated from a material that will withstand the particular solutions being used in the application without reacting and without reacting with the wafer material. The lifter may be made from quartz or a plastic having satisfactory corrosion and chemical resistance. Preferable examples of such plastics are fluorine resin, vinyl chloride, polyethylene, polypropylene, polybutyleneterephthalate (PBT), and polyehterehterkethone (PEEK). Preferable examples of fluorine resin are PVDF, PFA and PTFE (Teflon®).

Also, although the lifter 20 has been described generally for use in individually engaging a plurality of wafers, the lifter 20 can be used to engage a plurality of wafers that are contained within a wafer cassette.

As previously noted, the lifter can be used in any of a variety of wafer cleaning processes using a variety of different cleaning agents, and thus is not limited simply to the described wet bench applications of etching and rinsing. Alternative materials, compatible with the particular cleaning processes, can also be used to construct the inventive lifter.

While the foregoing invention has been described with reference to the above embodiments, various modifications and changes can be made without departing from the spirit of the invention. Accordingly, all such modifications and changes are considered to be within the scope and range of equivalents of the appended claims.

The invention claimed is:

1. A semiconductor wafer handling device, comprising:
   a first process tank having a fluid supply line for supplying fluid to the tank;
   a lift control apparatus;
   a lifting member positionable within the process tank using the lift control apparatus, the lifting member comprising a horizontal wafer engaging portion for engaging a semiconductor wafer and a vertical lifting portion for engaging the lift control apparatus, the vertical lifting portion having a front surface and a back surface, the horizontal wafer engaging portion and the vertical lifting portion oriented such that a side surface of a semiconductor wafer engaged by the horizontal wafer engaging portion is positioned adjacent to, and parallel with, the front surface of the vertical lifting portion, wherein at least one fluid-flow bore is disposed within the vertical lifting portion in communication with said front and back surfaces;
   wherein when the lifting member is positioned within the tank and fluid is supplied to the tank via the fluid supply line, the fluid is movable through the fluid-flow bore to contact the side surface of the semiconductor wafer; and
   wherein the fluid-flow bore has a bore axis oriented substantially non-perpendicular to at least one of the front and back surfaces of the lifting member.

2. The device of claim 1, wherein the wafer engaging portion is oriented substantially perpendicular to the lifting member.

3. The device of claim 2, wherein the wafer engaging portion comprises a plurality of rib elements.

4. The device of claim 1, wherein the lifting member comprises a plurality of fluid-flow bores in communication with the front and back surfaces of the lifting member.

5. The device of claim 4, wherein each fluid flow bore has a bore axis, and the axis of at least one bore is oriented at an acute angle with respect to at least one of the front and back surfaces of the lifting member.

6. The device of claim 5, wherein the axis of at least one fluid-flow bore is substantially perpendicular to at least one of the front and back surfaces.

7. A semiconductor wafer handling device, comprising:
   a fluid process tank;
   a fluid circulation loop for supplying fluid to the fluid process tank;
   a lift control apparatus;
   a wafer lifter comprising a horizontal wafer support portion and a vertical wafer lifting portion, the horizontal wafer support portion being configured to engage a plurality of semiconductor wafers, the vertical wafer lifting portion connected to the lift control apparatus for moving the wafer lifter with respect to the fluid process tank, the horizontal wafer engaging portion and the vertical lifting portion oriented such that a side surface of a semiconductor wafer engaged by the horizontal wafer support portion is positioned adjacent to, and parallel with, the front surface of the vertical wafer lifting portion, the vertical lifting portion having a through-bore disposed within the lifting portion, the through-bore being in communication with front and back surfaces of the lifting portion;
   wherein the fluid circulation loop supplies fluid to the fluid process tank, and the fluid is movable through the bore to contact the side surface of the semiconductor wafer; and
   wherein the through-bore has a bore axis oriented substantially non-perpendicular to at least one of the front and back surfaces of the lifting portion.

8. The device of claim 7, wherein the wafer support portion is oriented substantially perpendicular to the wafer lifting portion.

9. The device of claim 8, wherein the fluid recirculation loop comprises a pump and a filter for particulate matter from the tank fluid.

10. The device of claim 7, wherein the lifting portion comprises a plurality of fluid-flow bores in communication with the front and back surfaces of the lifting member.

11. The device of claim 10, wherein each bore has a bore axis, and the axis of at least one bore is oriented at an acute angle with to at least one of the front and back surfaces of the lifting member.

12. The device of claim 11, wherein the axis of at least one fluid-flow bore is substantially perpendicular to at least one of the front and back surfaces.

* * * * *

UNITED STATES PATENT AND TRADEMARK OFFICE
CERTIFICATE OF CORRECTION

PATENT NO.        : 7,730,898 B2
APPLICATION NO.   : 11/069129
DATED             : June 8, 2010
INVENTOR(S)       : Yang Chen Hung et al.

It is certified that error appears in the above-identified patent and that said Letters Patent is hereby corrected as shown below:

Claim 11, Column 6, Line 61, after "angle with" insert -- respect --.

Signed and Sealed this

Twenty-third Day of November, 2010

David J. Kappos
*Director of the United States Patent and Trademark Office*